United States Patent [19]

Silverman

[11] 4,382,288
[45] May 3, 1983

[54] THIN FILM MAGNETIC BUBBLE DETECTOR

[75] Inventor: Peter J. Silverman, Palo Alto, Calif.

[73] Assignee: Intel Magnetics, Inc., Santa Clara, Calif.

[21] Appl. No.: 320,601

[22] Filed: Nov. 12, 1981

[51] Int. Cl.³ .............................................. G11C 19/08
[52] U.S. Cl. .......................................... 365/8; 365/43
[58] Field of Search ...................................... 365/8, 43

[56] References Cited

PUBLICATIONS

IBM Technical Disclosure Bulletin-vol. 24, No. 12, May 1982, p. 6594.

Primary Examiner—James W. Moffitt
Attorney, Agent, or Firm—Blakely, Sokoloff, Taylor & Zafman

[57] ABSTRACT

A magnetic bubble detector which includes chevron propagation elements and underlying thin film magnetoresistive members is described. A portion of the dummy detection member is misaligned from its overlying chevrons. This misalignment provides a bias to the detection circuitry. A negative voltage is detectable when no bubble is present and a positive potential when a bubble is present. This allows easy matching between the detector and sense amplifier.

12 Claims, 7 Drawing Figures

THIN FILM MAGNETIC BUBBLE DETECTOR

BACKGROUND OF THE INVENTION

1. Field of the Invention

The invention relates to the field of magnetic bubble detectors, particularly those employing thin film members.

2. Prior Art

It is important in magnetic bubble devices to reliably detect the presence (or absence) of magnetic bubbles. One of the more common bubble detectors consists of an interconnected line of permalloy chevrons. This material also exhibits a change in resistance when propagating a magnetic bubble and this change is measured to detect the presence of a bubble. Typically, an active detector element and a "dummy" detector element are coupled in a bridge-like circuit; the dummy element nulls out the effects of the rotating, in-plane magnetic field on the active element.

In another case of bubble detectors, sometimes referred to as thin film detectors, a thin strip of magnetoresistive material (referred to sometimes hereinafter as a detection member) is insulated from and disposed beneath the propagation elements such as a line of chevrons. As a bubble is propagated by the line of chevrons, a change in resistance is sensed in the thin film member. (These members are typically 50–100 nm thick whereas the overlying permalloy elements are typically 500 nm thick.) Thin film elements have the advantage of providing an output signal which may be 4 times as large as the signal provided by a chevron detector. Obviously, thin film elements require additional processing for fabrication.

Thin film members are also coupled in a bridge-like configuration with a dummy member, again to null out the effects of the rotating, in-plane magnetic field. Such a detector is shown in FIG. 1 and will be discussed in more detail in conjunction with this figure.

The primary object of the present invention is to provide a reliable bubble detector. This is accomplished by providing a detector wherein the signal output from the detector is of a first polarity when no bubble is detected and of an opposite polarity when a bubble is present. This signal is easily matched to a sense amplifier. There have been numerous attempts in the prior art to match magnetic bubble detectors with sense amplifiers, or to otherwise provide matching between dummy detector members and active detector members. See, for example, U.S. Pat. Nos. 4,078,230; 4,146,867 and 4,035,785. Also see copending application Ser. No. 163,574 filed June 27, 1980 now U.S. Pat. No. 4,300,209 entitled "Method for Adjusting Signal Level Output From a Magnetic Bubble Detector", assigned to the assignee of the present application.

SUMMARY OF THE INVENTION

The present invention provides an improvement in a magnetic bubble detector which includes a first propagation element for propagating magnetic bubbles and an active detection member which is disposed beneath and insulated from the first propagation element. The active detection member and first element are aligned with respect to one another so as to allow detection of magnetic bubbles propagated through the first element. A second propagation element and a dummy detection member are also used to compensate for the effects of a rotating in-plane magnetic field. With the improvement of the present invention, the dummy detection member includes a first portion which is aligned with respect to the second propagation element in the same manner as the alignment between the first element and the active detection member. The dummy detection member, however, also includes a second portion which is differently aligned with respect to the second propagation element. The signal from the dummy member can be used to provide more reliable detection of bubbles. Specifically, a negative signal is detected when no bubble is present and a positive signal when a bubble is present.

BRIEF DESCRIPTION OF THE DRAWINGS

(FIGS. 2a and 2b are used to describe certain magnetic coupling which is put to use in the present invention.)

DETAILED DESCRIPTION OF THE INVENTION

An improved thin film magnetic bubble detector is described. In the following description numerous specific details are set forth, however, it will be obvious to one skilled in the art that the present invention may be practiced without these specific details. In other instances, well-known structure and processes have not been shown in detail in order not to obscure the present invention in unnecessary detail.

Figure 1:
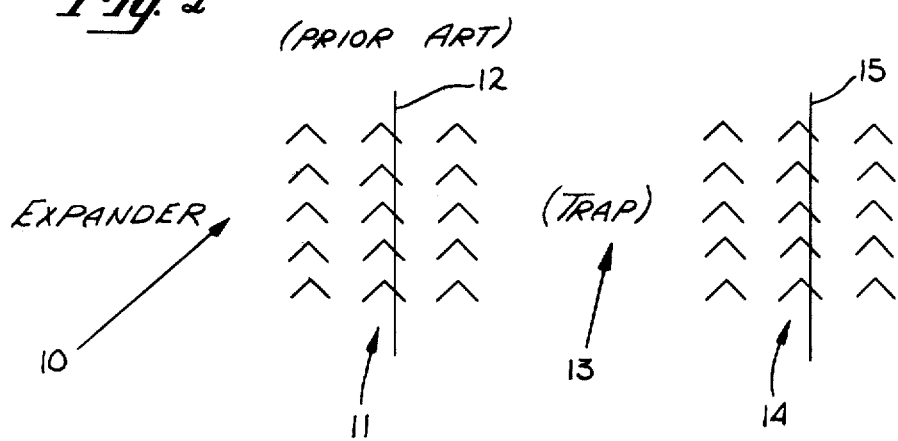
FIG. 1 is a plan view of a prior art thin film magnetic bubble detector.

Referring to FIG. 1, a typical prior art thin film detector is illustrated. The detector includes an expander section 10 not shown in detail. Bubbles are propagated through this expander and expanded onto the lines of chevrons such as line 11. A magnetoresistive detection member such as member 12 is insulated from and disposed beneath (or above) the line of chevrons 11. As a magnetic bubble is propagated through the line of chevrons 11, the resistance of member 12 changes and thus the presence of the bubble can be detected. The bubbles are propagated from chevrons 11 into a trap 13. The typical prior art detector also includes a dummy propagation element 14 and dummy detection member 15. The size and shape of chevrons 14 and member 15 (and surrounding propagation elements) are typically identical to the size and shape of the line of chevrons 11 and member 12. The detection members 12 and 15 are coupled in a bridge circuit so as to null out the effect of the rotating, in-plane magnetic field on the detection members. Obviously, no bubbles are propagated past the trap 13 into chevrons 14.

The multiplexing of signals from detectors such as shown in FIG. 1 and a method for optimizing the output from the detection members is described in copending application, Ser. No. 229,345 filed Jan. 29, 1981, entitled "Multiplexed Magnetic Bubble Detectors" and assigned to the assignee of the present invention. The multiplexing technique and optimizing technique described in this copending application is applicable to the present invention.

In the prior art and with the present invention, a magnetic bubble device is typically fabricated on a substrate such as a garnet substrate. An ion implanted magnetic garnet (generally an epitaxial layer) is employed on the substrate for the magnetic bubble storage layer. The single wall domains are moved in this layer as is well-known. A silicon dioxide layer which in the preferred embodiment is 150 nm thick is formed over this epitaxial layer. Then the detection members are fabricated from a magnetoresistive material such as permalloy on the silicon dioxide layer using ordinary photolithographic techniques. In the presently preferred embodiment these members are approximately 2000 nm wide and approximately 50 nm thick. An additional oxide layer is formed over the thin film members to insulate them from the overlying permalloy propagation elements. This additional oxide layer is approximately 150 nm thick in the presently preferred embodiment. The permalloy propagation elements such as the lines of chevrons are formed over this additional oxide layer in a well-known manner. Overlying protective layers and contacts are formed to complete the device, again, as is well-known in the art.

The bubble detectors of FIG. 1 (with detection members 12 and 15 coupled in a bridge circuit) should have no output when no bubbles are present and a positive output when bubbles are detected. However, due to typical process variations this is seldom the case. For example, the detection may provide a small positive output even though no bubbles are present and a larger positive output when bubbles are propagated through the line of chevrons 11. These process variations make it more difficult to reliably detect bubbles since the sense amplifiers cannot easily (and consistently) be matched to the detector. Ideally, the output from a detector should be negative with no bubbles present and positive when bubbles are present, however, with the prior art detectors it is difficult to obtain this ideal condition.

Figure 2A:
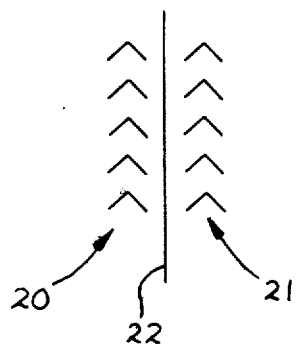
FIG. 2a is a plan view showing two lines of chevrons with a centrally disposed detection member.

In experimentations aimed at providing a better detector it was noted that a thin film detector member placed between propagation elements is more greatly effected by the rotating, in-plane magnetic field than a detection member (or dummy member) disposed beneath a propagation element. Referring to FIG. 2a, two lines of chevrons 20 and 21 are illustrated. A detection member 22 similar to the members 12 or 15 of FIG. 1 is disposed between the lines of chevrons rather than beneath them. The resistance variations of member 22, as mentioned, are more greatly effected by the in-plane field. Apparently, as shown in the cross-sectional view of FIG. 2b, the member 22 provides a low reluctance path 23 between the chevrons such as chevrons 20a and 20b. This apparent saturation of member 22 is put to advantage in the present invention.

Figure 3:
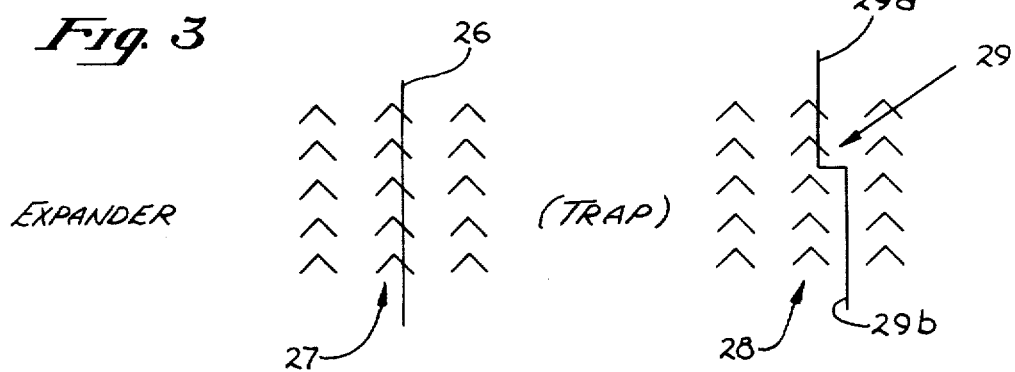
FIG. 3 is a plan view of a magnetic bubble detector built in accordance with the present invention.
Figure 4:
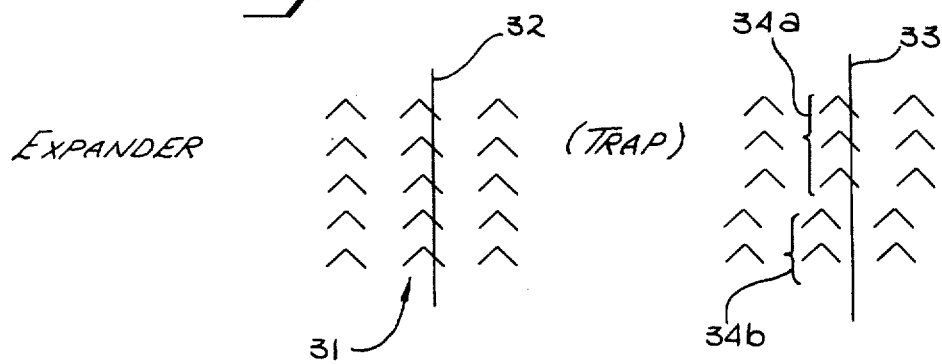
FIG. 4 is a plan view of another magnetic bubble detector built in accordance with the present invention.

In general, referring to FIGS. 3 and 4, a portion of the dummy detection members is displaced from its overlying chevron element to provide a bias, for example, note portion 29b of FIG. 3. This bias, particularly when used in an unclamped strobe detection arrangement, assures a positive potential when bubbles are present and a negative potential when no bubbles are present.

Figure 2B:
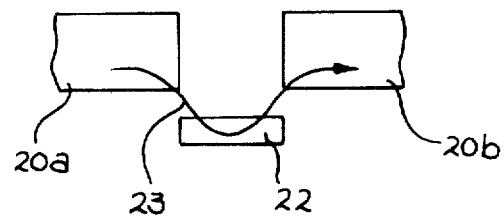
FIG. 2b is a cross-sectional elevation view of the structure of FIG. 2.

More specifically, referring to FIG. 3, the detector of FIG. 3 is somewhat similar to the detector of FIG. 1 except for the portion 29b of the dummy detection member 29. The detector of FIG. 3 includes an expander section for expanding magnetic bubbles which bubbles are propagated through the line of chevrons 27. As the bubbles are propagated through these chevrons the presence of the bubble is detected by the active detection member 26 since its resistance changes. The bubbles are then lost in the trap. A line of chevrons 28 (corresponding to chevrons 14 of Figure) are disposed above member 29. The portion 29a of the dummy member 29 is aligned with the overlying chevrons 28 in the same relationship as the active detection member 29 is aligned to the chevrons 27. A second portion 29b of the dummy element 29 is intentionally misaligned with chevrons 28. The portion 29b as described in conjunction with FIG. 2b, is more influenced by the rotating, in-plane magnetic field. When the members 26 and 29 of FIG. 3 are coupled in a bridge circuit, the offset portion 29b provides a continuous bias.

Figures 5A, 5B:
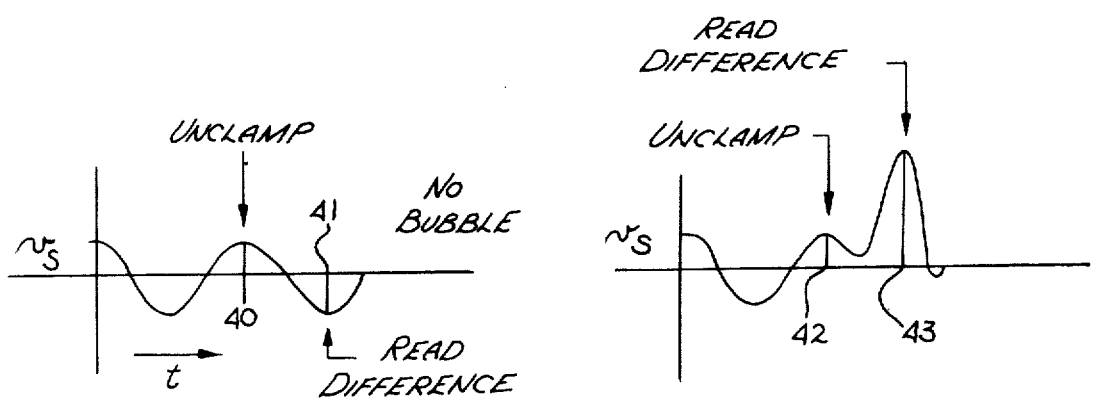
FIG. 5a is a waveform diagram illustrating the output signal when no bubble is present from a bubble detector built in accordance with the present invention.
FIG. 5b is a waveform diagram illustrating the output signal when a bubble is present from a bubble detector built in accordance with the present invention.

The output signal ($v_S$) from the detector of FIG. 3 is shown in FIG. 5a for the case when no bubbles are at element 27. The detection circuit (sense amplifier) used in the presently preferred embodiment is unclamped at time 40 and strobed at time 41. The difference between the potentials at time 40 and at time 41 is determined. If the sinewave-like signal of FIG. 5a has a peak-to-peak difference of approximately 3 mv then the output from the detection circuit will be −3 mv with no bubbles present at element 27.

The waveform from the detector is shown in FIG. 5a for the case when a bubble is being propagated through the element 27. There is a substantial positive peak at time 43 caused by the magnetic bubble passing above the member 26. Again if this circuit is unclamped at time 42 and a difference between the potentials at times 42 and 43 determined, a substantial positive potential will be detected, for instance, a potential of approximately 20 mv.

Thus, when no bubble is being propagated by element 27, a negative potential is measured whereas when a bubble is being propagated a positive potential is measured. Even taking into account typical process variations one can expect a slightly negative or at worst, zero output from the detection circuit when no bubble is present and a strong positive potential when a bubble is present.

In FIG. 4, the detector again includes an expander and an active detection member 32 disposed beneath and insulated from a line of chevrons 31. Bubbles propagated through element 31 are again trapped. In the dummy section, a portion of the chevrons in each line of chevrons are misaligned for the remainder of the chevrons. For example, chevrons 34b are misaligned from the chevrons 34a. The dummy detection member 33 is a straight member, that is it does not include an offset portion such as portion 29b of FIG. 3. Instead, the same misalignment of FIG. 3 is obtained by misaligning a portion of the chevrons such as chevrons 34b. The waveforms of FIGS. 4a and 5b are the same for the embodiment of FIGS. 3 and 4.

The "bias" level from the detectors of FIGS. 3 and 4 can be mathematically estimated. More specifically, if the offset length (such as portion 29b) is 1 and the total length of the thin film detector is L, then the bias level is given by:

$$v_s = \frac{V}{2} \frac{l}{L} \frac{\Delta R}{R}$$

where V is the supply potential and R the resistance of the element.

Detectors have been fabricated using the embodiments of both FIGS. 3 and 4 with a thin film member having a width of approximately 3000 nm, element gaps of 1600 nm, permalloy having ΔR/R of approximately 3%, supply voltage of 12 volts and l/L=0.05. For the configurations of both FIGS. 3 and 4, negative (no bubble) levels were obtained in agreement with the above equation. In particular, the no bubble level measured at 50 kHz with a complex data pattern ranged from −2.0 mv to −7.0 mv.

Thus, an improved thin film magnetic bubble detector has been described. A portion of the dummy detection element is misaligned from its overlying propagation element. This misaligned portion provides a bias which assures a negative voltage when no bubble is present at the active detection member and a positive potential when a bubble is detected at the active detection member.

I claim:

1. In a magnetic bubble detector which includes a first propagation element for propagating magnetic bubbles and an active detection member insulated from said first element and aligned with respect to said first element so as to detect magnetic bubbles propagated by said first element, and a second propagation element and a dummy detection member insulated from said second element for providing a signal to compensate for the effects of a rotating, in-plane magnetic field on said active detection member, an improvement wherein:

a first portion of said dummy detection member is aligned with respect to said second element in the same manner as said alignment between said first element and said active detection member, and a second portion of said dummy detection member is differently aligned with respect to said second element;

whereby the signal resulting from said dummy member may be used to provide more reliable detection of bubbles propagated by said first element.

2. The improvement defined by claim 1 wherein said first and second elements are chevron elements and wherein said first portion of said dummy member is disposed beneath said second element and said second portion is disposed to one side of said second element.

3. The improvement defined by claim 2 wherein said first and second portions of said dummy member are in-line with one another and wherein said second element includes a group of chevrons misaligned with the other chevrons in said second element.

4. The improvement defined by claim 2 wherein said first portion of said dummy member is not aligned with said second portion of said dummy member and wherein said second element comprises an aligned line of chevrons.

5. A magnetic bubble detector comprising:
   a first propagation element for receiving expanded magnetic bubbles;
   an active detection member insulated from said first element and aligned with respect to said first element so as to detect magnetic bubbles propagated by said first element;
   a second propagation element;
   a dummy detection member insulated from said second propagation element, said dummy member including a first portion which is aligned with respect to said second element in the same manner as said alignment between said first element and said active member and a second portion differently aligned with respect to said second element;
   whereby the signal from said dummy member can be used for more reliable detection of bubbles propagated by said first element.

6. The detector defined by claim 5 wherein said first and second elements are lines of chevrons and wherein said first portion of said dummy member is disposed beneath said second element and said second portion is disposed to one side of said second element.

7. The detector defined by claim 6 wherein said first and second portions of said dummy member are in line with one another and wherein said second element includes a group of chevrons nonaligned with the other chevrons in said second element.

8. The detector defined by claim 6 wherein said first portion of said dummy member is not aligned with said second portion of said dummy member and wherein said second element comprises an aligned line of chevrons.

9. A magnetic bubble detector comprising:
   an expander for expanding magnetic bubbles;
   a first line of chevrons for receiving expanded bubbles from said expander;
   an active detection member comprising a strip of magnetoresistive material disposed beneath and insulated from said first line of chevrons, said active member having a predetermined alignment with respect to said first line of chevrons;
   a second line of chevrons;
   a magnetic bubble trap disposed between said first line of chevrons and said second line of chevrons to prevent magnetic bubbles from propagating to said second line of chevrons;
   a dummy detection member disposed beneath and insulated from said second line of chevrons, said dummy detection member including a first portion having a first alignment with respect to said second line of chevrons and a second portion having a second alignment with respect to said second line of chevrons, said first and second alignments being different from one another;
   whereby the signal from said dummy member can be used to provide more reliable detection of bubbles propagated by said first element.

10. The detector defined by claim 9 wherein said first alignment between said second line of chevrons and said first portion of said dummy member is the same alignment as said predetermined alignment between said first line of chevrons and said first detection member.

11. The detector defined by claim 10 wherein said first and second portions of said dummy member are in line with one another and wherein said second line of chevrons includes a group of chevrons nonaligned with the other chevrons in said second line of chevrons.

12. The detector defined by claim 10 wherein said first portion of said dummy member is not aligned with said second portion of said dummy member and wherein said second line of chevrons comprises an aligned line of chevrons.

* * * * *